(12) United States Patent
Luo et al.

(10) Patent No.: US 7,981,808 B2
(45) Date of Patent: Jul. 19, 2011

(54) METHOD OF FORMING A GATE DIELECTRIC BY IN-SITU PLASMA

(75) Inventors: Tien Ying Luo, Austin, TX (US);
Olubunmi O. Adetutu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 8 days.

(21) Appl. No.: 12/241,139

(22) Filed: Sep. 30, 2008

(65) Prior Publication Data

US 2010/0081290 A1 Apr. 1, 2010

(51) Int. Cl.
*H01L 21/3205* (2006.01)
*H01L 21/31* (2006.01)
*H01L 21/336* (2006.01)

(52) U.S. Cl. ........ 438/761; 438/585; 438/287; 438/775; 438/197

(58) Field of Classification Search .................. None
See application file for complete search history.

(56) References Cited

U.S. PATENT DOCUMENTS

| 6,121,094 | A * | 9/2000 | Gardner et al. .............. 438/287 |
| 6,620,702 | B2 | 9/2003 | Shih et al. |
| 6,638,876 | B2 | 10/2003 | Levy et al. |
| 7,135,361 | B2 * | 11/2006 | Visokay et al. .............. 438/197 |
| 7,402,472 | B2 * | 7/2008 | Lim et al. .................... 438/197 |
| 2004/0121542 | A1 * | 6/2004 | Chang .......................... 438/261 |
| 2004/0188240 | A1 * | 9/2004 | Chang et al. ............ 204/192.12 |
| 2006/0197227 | A1 * | 9/2006 | Liang et al. .................. 257/761 |
| 2007/0093013 | A1 * | 4/2007 | Chua et al. .................. 438/197 |
| 2008/0001237 | A1 * | 1/2008 | Chang et al. ................. 257/411 |
| 2008/0050882 | A1 * | 2/2008 | Bevan et al. ................. 438/308 |

* cited by examiner

*Primary Examiner* — Bradley K Smith
*Assistant Examiner* — Mohammad Choudhry
(74) *Attorney, Agent, or Firm* — James L. Clingan, Jr.; Kim-Marie Vo

(57) ABSTRACT

A method of forming a gate dielectric layer includes forming a first dielectric layer over a semiconductor substrate using a first plasma, performing a first in-situ plasma nitridation of the first dielectric layer to form a first nitrided dielectric layer, forming a second dielectric layer over the first dielectric layer using a second plasma, performing a second in-situ plasma nitridation of the second dielectric layer to form a second nitrided dielectric layer; and annealing the first nitrided dielectric layer and the second nitrided dielectric layer, wherein the gate dielectric layer comprises the first nitrided dielectric layer and the second nitrided dielectric layer. In other embodiments, the steps of forming a dielectric layer using a plasma and performing an in-situ plasma nitridation are repeated so that more than two nitrided dielectric layers are formed and used as the gate dielectric layer.

6 Claims, 4 Drawing Sheets

METHOD OF FORMING A GATE DIELECTRIC BY IN-SITU PLASMA

BACKGROUND

1. Field

This disclosure relates generally to integrated circuits, and more specifically, to forming gate dielectrics for transistors of an integrated circuit.

2. Related Art

Gate dielectrics are a very significant factor in the performance of a transistor and thus the performance of an integrated circuit made up of such transistors. The historic preferred gate dielectric has been a silicon oxide grown at very high temperature. This is often called a thermally grown oxide. Reducing the thickness of a gate dielectric is a known way of enhancing coupling between gate and channel and thus improving speed but adversely effects leakage and reduces breakdown voltage. Thus much work has been done in developing high K dielectrics for use as a gate dielectric so that gate to channel coupling is enhanced but enough thickness is retained to have low leakage and reasonable breakdown voltage. The most promising of the high K materials have been various metal oxide. There have been many difficulties in obtaining the desired result for metal oxides. One problem is growing an excessively large interfacial oxide layer at the interface with the substrate, which is most commonly silicon. This interfacial oxide layer is very difficult to prevent completely, but it is preferably as thin as possible. In order to minimize the interfacial oxide thickness, the oxygen concentration applied in the formation of the metal oxide is kept as low as possible to form the metal oxide. A problem arising from keeping the oxygen concentration relatively low is that the resulting metal oxide layer has oxygen vacancies, locations where oxygen atoms should be present but are not present. The oxygen vacancies, when excessive, cause a reliability problem. With usage, the threshold voltage shifts. The direction of the shift depends on the particular metal oxide used, but it is a reliability problem either way. If the magnitude of the threshold voltage decreases, the transistors may not turn off completely and cause excessively leakage and may even result in a logic operational failure. If the magnitude of the threshold voltage increases, the speed of operation can decrease excessively and either reduce the speed of operation below the required speed or even cause an operational failure.

Nitrogen has been used to fill the oxygen vacancies and reduce Hf dangling bonds to prevent the attendant reliability issues. A benefit of using nitrogen is that there is also an increase in the dielectric constant. A problem with nitrogen is that nitrogen atoms at the interface with the substrate can reduce the mobility in the channel. Thus, it is desirable for nitrogen to be present in most of the thickness but not at the interface with the substrate. This has been difficult to achieve, especially while continuing to minimize interfacial oxide growth. Ammonia $NH_3$ as a source of nitrogen does well in filling the vacancies but reaches the substrate very easily so the resulting nitrogen concentration is undesirably high at the interface with the substrate. In addition, hydrogen release during an ammonia anneal degrades gate oxide quality.

Accordingly, there is a need for a method for obtaining nitrogen in a metal oxide gate dielectric that avoids or reduces one or more of the problems described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a method for forming a gate dielectric includes a first dielectric layer over a substrate formed using plasma in a chamber. Without removing the substrate from the chamber, the first dielectric layer is treated with plasma nitride. Nitrogen ions are formed and react well to fill vacancies in the first dielectric layer. By using plasma, the temperature is kept relatively low so that the nitrogen ions do not easily reach the semiconductor layer. Immediately, i.e, without performing an anneal, after the plasma nitridation step and without removing the substrate from the chamber, a second dielectric layer is formed using plasma. Still without removing the substrate, a nitridation is performed on the second dielectric layer. After the nitridation treatment of the second dielectric layer, an anneal is performed.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
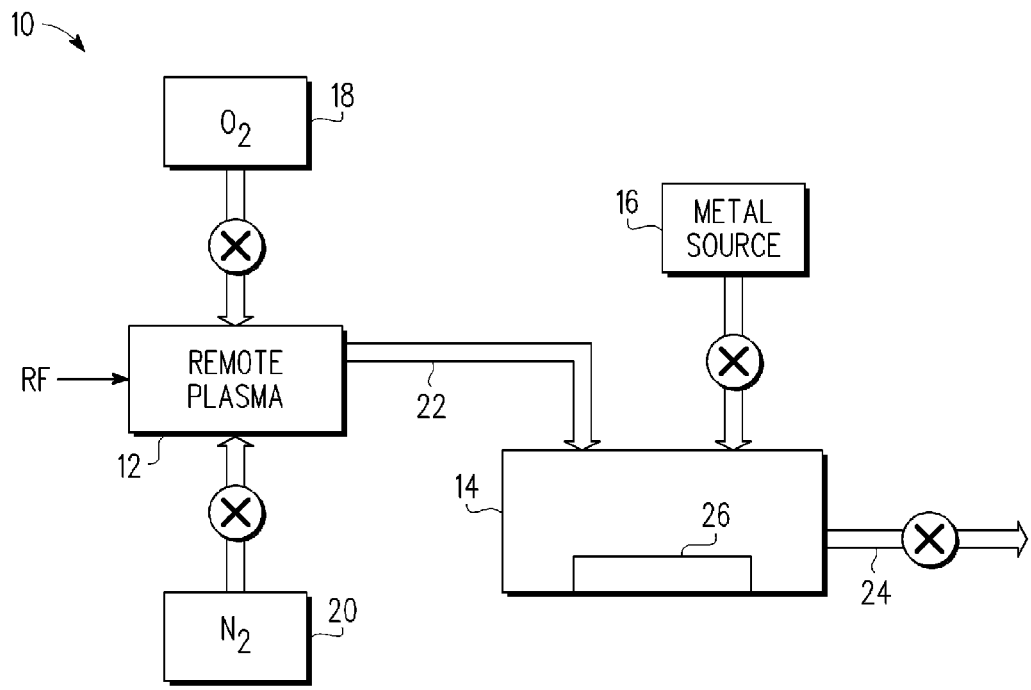
FIG. 1 is an apparatus for use in performing a method according to an embodiment.

Shown in FIG. 1 is an apparatus 10 comprising a remote plasma block 12 for providing plasma treatment to a gas, a chamber 14, a metal source container 16 coupled to the chamber, an oxygen container 18 coupled to the remote plasma block, a nitrogen container 20 coupled to remote plasma block 12, a conduit 22 coupling remote plasma block 12 to chamber 14, an exhaust 24 coupled to chamber 14, a substrate 26 in chamber 14. In this example, substrate 26 is a wafer that has many different semiconductor die. In operation substrate is placed in chamber 14 and chamber 14 is not opened again until two dielectric layers are formed on substrate 26 and a nitridation has been performed on each of the two dielectric layers. Thus, the steps of forming the two dielectric layers and the nitridation steps are performed in-situ because the chamber remains closed for these steps.

For a metal oxide deposition, oxygen $O_2$ is introduced from oxygen container 18 into remote plasma block 12 where it is subjected to RF so as to be oxygen ions as a plasma that is introduced into chamber and metal source 16 is introduced into chamber 14. The oxygen plasma and the metal source react together to form a metal oxide layer on substrate 26. By applying plasma, the temperature may be kept low, as low as 100 degrees Celsius or perhaps even lower. A metal oxide deposition step may preferably occur between 100 and 500 degrees Celsius. The metal source may be a metal precursor that carries the metal for use in forming an oxide in gas form. With hafnium oxide as an example of a metal oxide useful as a high k gate dielectric, the precursor may be hafnium t-butoxide HTB or hafnium chloride HCl. Exemplary parameters include a pressure below 10 Torr.

For a nitridation step, nitrogen $N_2$ is introduced into remote plasma block 12 where it is ionized by RF into a plasma that is introduced into chamber 14 through conduit 22. Parameters may be a temperature of room temperature to 550 degrees Celsius, 10 millitorr to 10 Torr, 5 to 60 seconds, and RF power between 40 to 500 watts.

Figure 2:
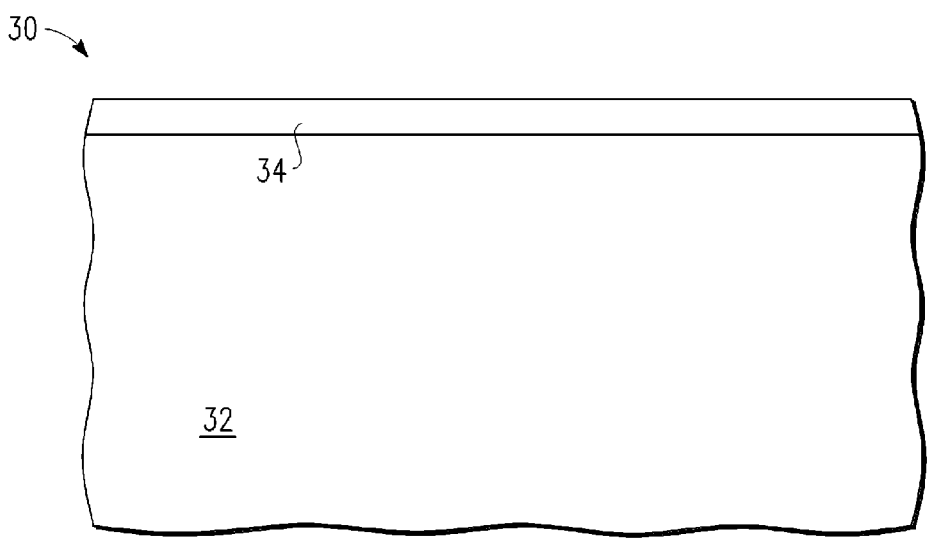
FIG. 2; is a cross section of a semiconductor device at a stage in the method.

Shown in FIG. 2 is a semiconductor device 30 comprising a semiconductor substrate 32 and a dielectric layer 34 over substrate 32. Substrate 32 preferably is either silicon or has a silicon layer at the top portion. There may be thin interfacial oxide layer at the interface between dielectric layer 34 and substrate 32. The interfacial oxide layer is difficult to avoid but is not shown in this drawing. Dielectric layer 34 may be a metal oxide such as hafnium oxide and is formed using plasma. In the case of dielectric layer 34 being hafnium oxide, oxygen is formed into a plasma with RF and reacted with the hafnium in one of the precursors described earlier. Dielectric layer 34 may be about 10 Angstrom thick. In addition, zirconium and lanthanum are effective for dielectric layer 34.

Figure 3:
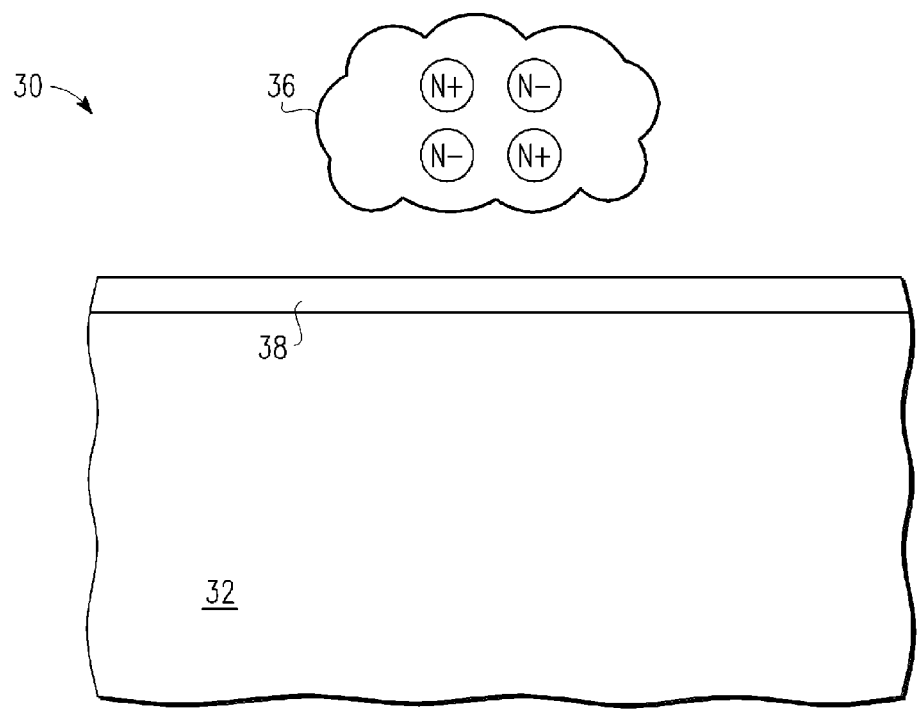
FIG. 3 is a cross section of the semiconductor device of FIG. 2 at a subsequent stage in processing.

Shown in FIG. 3 is semiconductor device 30 after applying nitrogen plasma 36 to dielectric layer 34 to convert dielectric layer 34 to a dielectric layer 38 that contains nitrogen. Plasma 36 is formed in-situ with regard to dielectric layer 34.

Figure 4:
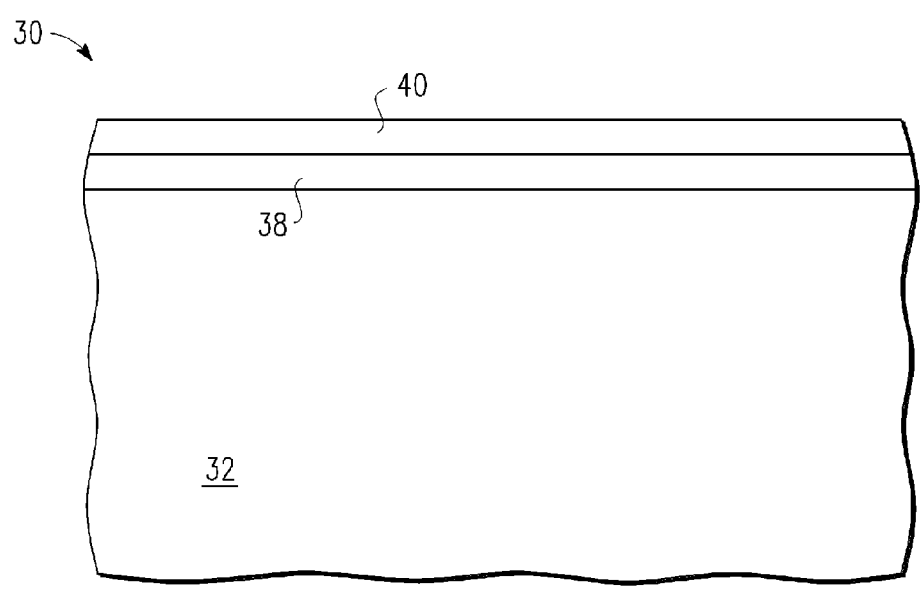
FIG. 4 is a cross section of the semiconductor device of FIG. 3 at a subsequent stage in processing.

Shown in FIG. 4 is semiconductor device 30 after forming a dielectric layer 40 by plasma and in-situ relative to the nitridation step described relative to FIG. 3. Dielectric layer 40 may be formed the same way as dielectric layer 34 and may be the same thickness.

Figure 5:
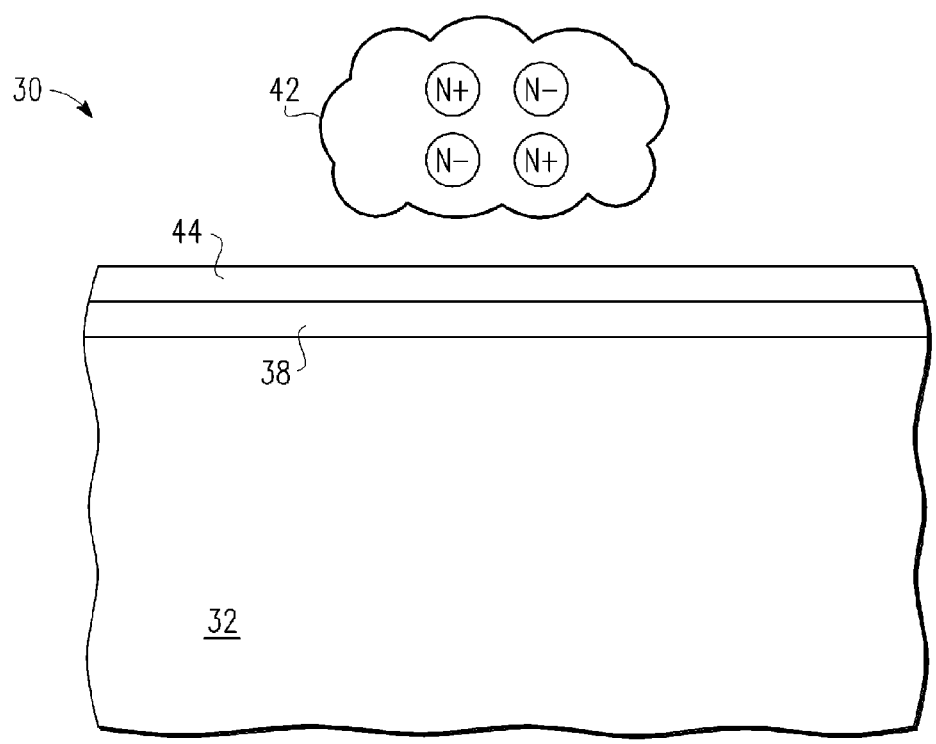
FIG. 5 is a cross section of the semiconductor device of FIG. 4 at a subsequent stage in processing.

Shown in FIG. 5 is semiconductor device 30 after applying nitrogen plasma 42 to dielectric layer 40 to convert dielectric layer 40 to a dielectric layer 44 that contains nitrogen. Plasma 42 is formed in-situ with regard to dielectric layer 40.

Figure 6:
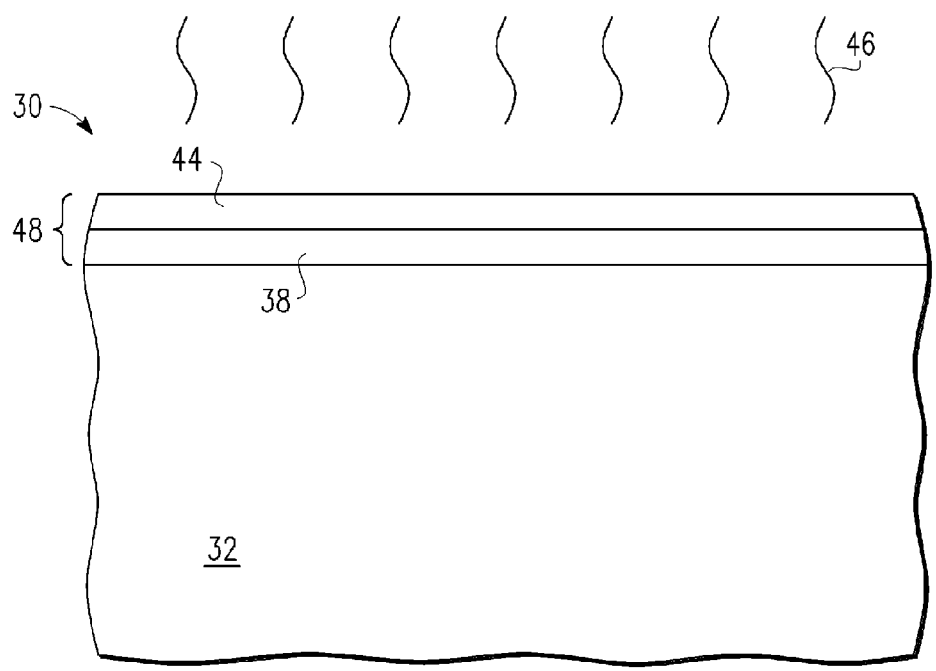
FIG. 6 is a cross section of the semiconductor device of FIG. 5 at a subsequent stage in processing.

Shown in FIG. 6 is semiconductor device 30 after performing an anneal 46. Anneal 46 may first include removing substrate 26 from chamber 14 but may also be performed in-situ. Anneal 46 may be 300 to 1000 degrees Celsius for one minute to 15 seconds, respectively at 0.5 to 760 Torr, in an oxygen and argon ambient or oxygen and nitrogen ambient. The ambient is preferably at about 10 percent oxygen. The combination of dielectric layers 40 and 44, and potentially additional layers of nitrided dielectric layers formed using plasma, form a gate dielectric 48.

Figure 7:
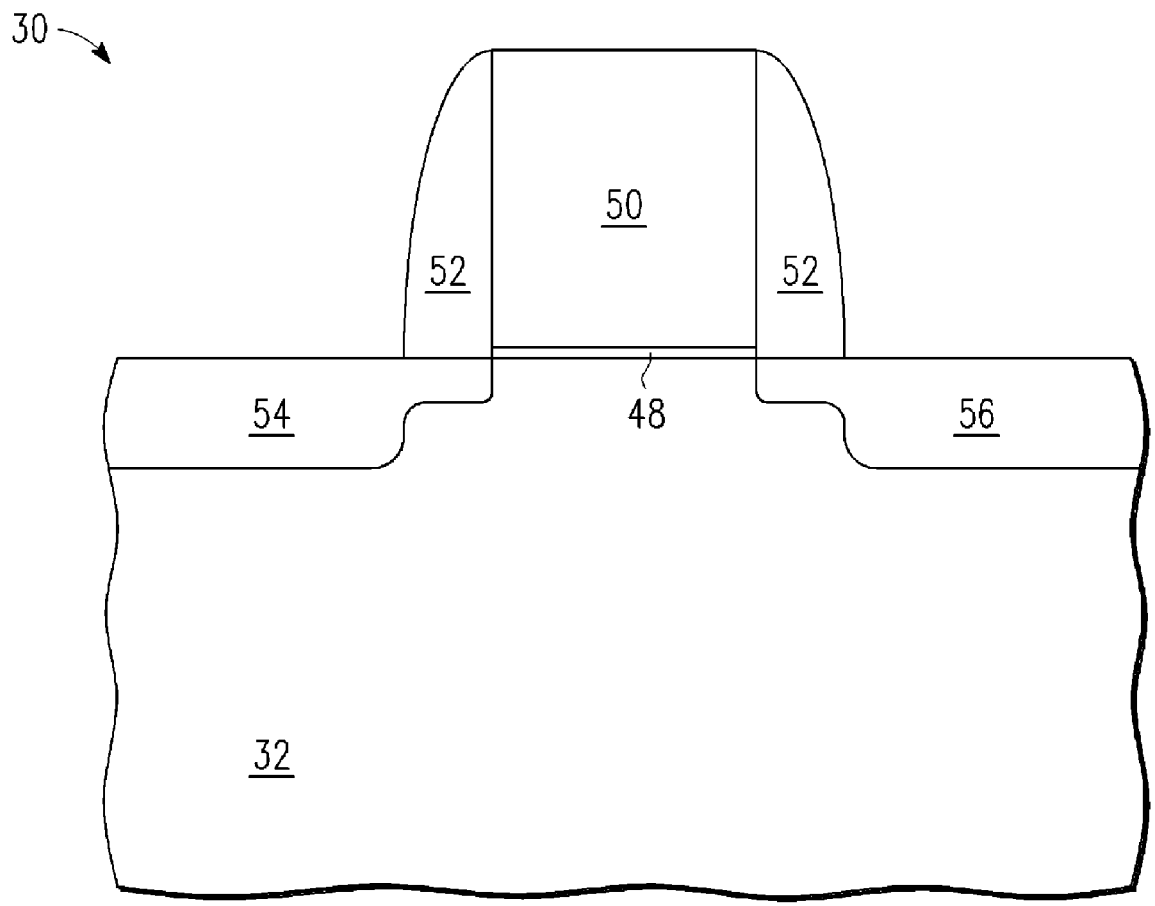
FIG. 7 is a cross section of the semiconductor device of FIG. 6 at a subsequent stage in processing.

Shown in FIG. 7 is semiconductor device 30 after forming a gate 50 over gate dielectric 48, a sidewall spacer 52 formed around gate 50, a source/drain 54 in substrate 32 substantially aligned to one side of gate 50, and a source/drain 56 substantially aligned to an opposite side of gate 50. Semiconductor device 30 of FIG. 7 shows a completed transistor using gate dielectric 48. The region in substrate 32 immediately under the gate and between source/drain regions 54 and 56 is a channel of the transistor. Gate 50 may be multiple layers of conductive material. Sidewall spacer 52 similarly may be multiple layers of materials.

A transistor having a gate dielectric formed in the manner described has benefits of a nitrogen content that allows for forming the metal oxide with little interfacial oxide and providing nitrogen to fill oxygen vacancies and increase dielectric constant in a manner that is in-situ to avoid contamination and avoids high nitrogen content at the interface with the substrate in the channel. Using plasma for both the metal oxide formation and the nitridation allows for excellent temperature control. High heat is not required for obtaining the needed reaction in the case of forming the metal oxide and is not required for achieving nitridation. Also, having the plasma formation remote from the chamber reduces the risk of some of the high energy ions of the plasma impacting the surface of the gate dielectric and thereby damaging the surface of the gate dielectric. By having all of the steps of forming the gate dielectric itself performed in-situ, which is enabled by all of them being plasma, the gate dielectric has reduced risk of contamination. Further no anneal is needed until all of the gate dielectric is performed. This provides greater control of the nitrogen penetration to the interface with the substrate.

By now it should be apparent that there is a method of forming a gate dielectric layer. The method includes forming a dielectric layer over a semiconductor substrate using a plasma in a chamber of a tool. The method further includes performing a plasma nitridation of the dielectric layer in the chamber of the tool to form a nitrided dielectric layer. The method further includes repeating the steps of forming the dielectric layer and performing a plasma nitridation a predetermined number of times. The method further includes annealing the nitrided dielectric layer after the step of repeating the steps of forming the dielectric layer and performing a plasma nitridation. The method may be further characterized by the step of forming the dielectric layer comprising a process selected from the group consisting of plasma enhanced atomic layer deposition (PE-ALD) and plasma enhanced chemical vapor deposition (PE-CVD). The method may be further characterized by the step of forming the dielectric layer comprising reacting oxygen ions in the plasma with the semiconductor substrate. The method may be further characterized by the step of forming the dielectric layer comprising forming a metal oxide layer. The method may be further characterized by the step of forming the metal oxide layer comprising forming the metal oxide layer comprising an element selected from hafnium, zirconium, and lanthanum. The method may be further characterized by the step of forming the dielectric layer comprising forming a silicon dioxide layer. The method may be further characterized by performing a plasma nitridation of the dielectric layer using a remote plasma. The method may be further characterized by the step of forming a dielectric layer over a semiconductor substrate further comprising introducing oxygen ion formed using a remote plasma into the chamber and introducing metal ions into the chamber. The method may be further characterized by the step of repeating the steps of forming the dielectric layer and performing a plasma nitridation a predetermined number of times comprising repeating the steps of forming the dielectric layer and performing the plasma nitridation at least one time. The method may be further characterized by the step of forming the dielectric layer occurs at approximately room temperature.

Also described is a method of forming a gate dielectric layer. The method includes forming a first dielectric layer over a semiconductor substrate using a first plasma. The method further includes performing a first in-situ plasma nitridation of the first dielectric layer to form a first nitrided dielectric layer. The method further includes forming a second dielectric layer over the first dielectric layer using a second plasma. The method further includes performing a second in-situ plasma nitridation of the second dielectric layer to form a second nitrided dielectric layer. The method further includes annealing the first nitrided dielectric layer and the second nitrided dielectric layer, wherein the gate dielectric layer comprises the first nitrided dielectric layer and the second nitrided dielectric layer. The method may be further characterized by the step of forming the second dielectric layer being performed after the step of performing the first in-situ plasma nitridation and an anneal is not performed there between. The method may be further characterized by the steps of forming the first dielectric layer and forming the second dielectric layer being performed using the same processes. The method may be further characterized by the steps of forming the first dielectric layer and forming the second dielectric layer being performed using a process selected from the group consisting of plasma enhanced atomic layer deposition (PE-ALD), plasma enhanced chemical vapor deposition (PE-CVD), and reaction of oxygen ions with the semiconductor substrate. The method may be further characterized by the steps of performing the first in-situ plasma nitridation and performing the second in-situ plasma nitridation being performed using the same processes. The method may be further characterized by the steps of performing the first in-situ plasma nitridation and performing the second in-situ plasma nitridation being performed using a process selected from the group consisting of plasma enhanced atomic layer deposition (PE-ALD), plasma enhanced chemical vapor deposition (PE-CVD), and reacting nitrogen ions with the first or second dielectric layer. The method may be further characterized by the step of forming the first dielectric layer comprising forming a material selected from the group consisting of a metal oxide layer and a silicon dioxide layer. The method may be further characterized by the performing the first in-situ plasma nitridation comprising using a remote plasma. The method may be further characterized by the step of forming a first dielectric layer over a semiconductor substrate further comprising reacting oxygen ions formed using a remote plasma and metal ions with the semiconductor substrate.

Additionally described is a of forming a gate dielectric layer. The method includes forming a dielectric layer over a semiconductor substrate using a first plasma. The method further includes incorporating nitrogen into the dielectric layer using a second plasma. The the step of incorporating nitrogen is performed in the same chamber as the step of forming the dielectric layer. The second plasma is different than the first plasma. The method further includes repeating the steps of forming the dielectric layer and incorporating nitrogen for a predetermined number of times without performing an anneal after incorporating the nitrogen except when the predetermined number of times is reached.

Although the invention is described herein with reference to specific embodiments, various modifications and changes can be made without departing from the scope of the present invention as set forth in the claims below. For example, anneal was described as being 15 to 60 seconds but a shorter anneal may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a gate dielectric layer, the method comprising:
    depositing a first dielectric layer over a semiconductor substrate by introducing oxygen plasma in a chamber of a tool from a remote plasma block of the tool and introducing a metal into the chamber from a metal source so as to form the first dielectric be a metal oxide;
    performing a plasma nitridation of the first dielectric layer in the chamber of the tool to form a nitrided dielectric layer by introducing nitrogen plasma into the chamber from the remote plasma block;
    after performing the plasma nitridation of the first dielectric layer, before any anneal occurring after the step of forming the first dielectric layer, and without removing the semiconductor substrate from the chamber of the tool, depositing a second dielectric layer on the nitrided dielectric layer using oxygen plasma from the remote plasma block and metal from the metal source so as to form the second dielectric layer to be the metal oxide;
    performing a plasma nitridation of the second dielectric layer without removing the semiconductor substrate from the chamber of the tool to form a second nitrided dielectric layer by introducing nitrogen plasma into the chamber from the remote plasma block; and
    annealing the first and second nitrided dielectric layers after the step of performing a plasma nitridation of the second dielectric layer.

2. The method of claim 1, wherein the step of depositing the dielectric layer comprises a process selected from the group consisting of plasma enhanced atomic layer deposition (PE-ALD) and plasma enhanced chemical vapor deposition (PE-CVD).

3. The method of claim 1, wherein the step of depositing the first dielectric layer comprises forming the metal oxide layer comprising an element selected from hafnium, zirconium, and lanthanum.

4. The method of claim 1, wherein the step of forming the first dielectric layer occurs at approximately room temperature.

5. A method of forming a gate dielectric layer comprising:
    depositing a first hafnium oxide layer over a semiconductor substrate in a chamber using a first oxygen plasma introduced into the chamber from a remote plasma block coupled to an oxygen source and a first precursor containing hafnium;
    performing a first in-situ plasma nitridation of the first dielectric layer by introducing a first nitrogen plasma into the chamber from the remote plasma block coupled to a nitrogen source to form a first nitrided dielectric layer;
    depositing, in-situ, a second dielectric layer over the first dielectric layer using a second oxygen plasma introduced into the chamber from a remote plasma block and a second precursor containing hafnium after the step of performing the first in-situ plasma nitridation and before any anneal occurring after forming the first hafnium oxide layer;
    performing a second in-situ plasma nitridation of the second dielectric layer by introducing a second nitrogen plasma into the chamber from the remote plasma block to form a second nitrided dielectric layer; and
    annealing the first nitrided dielectric layer and the second nitrided dielectric layer, wherein the gate dielectric layer comprises the first nitrided dielectric layer and the second nitrided dielectric layer.

6. The method of claim 5, wherein the steps of depositing the first dielectric layer and depositing the second dielectric layer are performed using the same processes.

* * * * *